United States Patent [19]

Ezekiel et al.

[11] 4,315,224

[45] Feb. 9, 1982

[54] LASER STIMULATED RAMAN MOLECULAR BEAM TIME AND FREQUENCY STANDARD

[75] Inventors: Shaoul Ezekiel, Lexington; Clare C. Leiby; Richard H. Picard, both of Bedford; Charles R. Willis, Newton, all of Mass.; Richard P. Hackel, Livermore, Calif.

[73] Assignee: The United States of America as represented by the Secretary of the Air Force, Washington, D.C.

[21] Appl. No.: 150,523

[22] Filed: May 16, 1980

[51] Int. Cl.³ .............................................. H03L 7/26
[52] U.S. Cl. ........................................... 331/3; 372/3
[58] Field of Search ...................... 331/3, 94; 250/201

[56] References Cited

U.S. PATENT DOCUMENTS 3,686,585  8/1972  Javan et al. ........................ 331/94.5
3,755,678  8/1973  Javan ............................... 250/211 J
4,121,178 10/1978  Schlossberg ................... 331/94.5 G

OTHER PUBLICATIONS

Grove et al., "Physical Review A", vol. 15, Jan. 1977, pp. 227-233.
Javan, "Physical Review", Sep. 15, 1957, pp. 1579-1589.
Schlossberg et al., "Physical Review", Oct. 7, 1966, pp. 267-284.
Hellwig, "Proc. IEEE", Feb. 1975, pp. 2112-2228.
Picque, "Metrologia", 13, 1977, pp. 115-119.
Leiby et al., "American J. of Physics", Sep. 1979, pp. 791-796.
Tamir, "Integrated Optics", vol. 7, Springer-Verlag, New York, 1975, ch. 4.
Hackel et al., "Physical Rev. Lett.", 25 June 1979, pp. 1736-1739.

Primary Examiner—David C. Nelms
Assistant Examiner—Darwin R. Hostetter
Attorney, Agent, or Firm—Donald J. Singer; Jacob N. Erlich

[57] ABSTRACT

A laser stimulated Raman molecular beam time and frequency standard utilizing a first electromagnetic beam at a first preselected frequency to pump a molecular beam at a first preselected point along the beam to state select the beam. A second electromagnetic beam (produced from either a different electromagnetic source than utilized to produce the first beam or produced from a portion of the first beam) at a second preselected frequency and a third electromagnetic beam at the first frequency simultaneously pump the molecules of the state selected molecular beam at a second point along the beam in a stimulated Raman process. By locking the frequency difference of the first and second electromagnetic beams to a specific resonant frequency, a time and frequency standard can be produced.

9 Claims, 3 Drawing Figures

LASER STIMULATED RAMAN MOLECULAR BEAM TIME AND FREQUENCY STANDARD

STATEMENT OF GOVERNMENT INTEREST

The invention described herein may be manufactured and used by or for the Government for governmental purposes without the payment of any royalty thereon.

BACKGROUND OF THE INVENTION

This invention relates generally to a device for producing a time and frequency standard, and, more particularly, to a simplified, small, rugged and relatively inexpensive laser stimulated Raman molecular beam time and frequency standard.

Most clocks, and in particular, clocks which are extremely accurate and precise are based, in their operation on frequency standards. For periodic events, the time between the events, t, is related to the frequency, $\nu$, of their occurrence by the simple equation $\nu = 1/t$. Periodic events can be used to define time, i.e., the generator of the periodic events—the frequency standard—can be used as a clock. The frequency standard becomes a clock by the addition of a counting mechanism for the events.

The first clocks based on a frequency standard (a pendulum) were invented about 400 years ago. This type of clock is still most widely used today. The pendulum may be a suspended weight (gravitational pendulum) like in "grandfather" clocks or the balance (torsion pendulum) of modern wristwatches. The instant invention deals with today's most advanced frequency standards and clocks; however, a close look at traditional clocks show all the essential features which are utilized in quartz crystal and atomic clocks.

The unit of time today is the second (symbol s). The second is defined in reference to a frequency determining element. Since 1967 by international agreement this "natural pendulum" is the cesium atom. One second is defined in the official wording as "the duration of 9 192 631 770 periods of the radiation corresponding to the transition between the two hyperfine levels of the ground state of the cesium-133 atom". Accordingly, the frequency of the cesium pendulum is 9 192 631 770 events per second (the cesium atom is very rapidly oscillating pendulum). The unit of frequency is then defined as hertz (symbol Hz) which means the repetitive occurrence of one event per second (the use of "hertz" is preferred to the older term "cycle per second", cps).

Many kinds of frequency determining elements have been and are being used in frequency standards. They can be grouped into three classes: mechanical resonators, electronic resonators, and atomic resonators.

As far as mechanical resonators are concerned most accurate clocks deal only with the quartz crystals. Other mechanical resonators like the pendulum and the tuning fork are of no importance in today's high performance frequency standards, although they have been historically very important and are still widely used in low performance devices (e.g. in watches). For similar reasons electronic resonators like tank circuits are unable to provide an adequate frequency standard for high precision clocks. Atomic resonators form the heart of our most accurate frequency standards and clocks.

It has recently been proposed (see Picque', Jean-Louis, "Hyperfine Optical Pumping of a Cesium Atomic Beam, and Applications," Metrologia, 13, 1977, pps 115–119) that laser atomic/molecular state selection be employed in time and frequency standards. In the case of atomic/molecular beam devices such as current cesium standards, laser state selection and state detection can replace magnetic state-selection and hot wire state detection. Consequently, atomic number densities in the interaction region can be increased by many orders of magnitude (i.e., $10^4$ to $10^6$) over those obtained in devices employing magnetic state selection. This translates into a corresponding increase in signal-to-noise ratio. Signal-to-noise, together with the greatly reduced response time of the laser state detection system, leads to greatly improved short term stability for the device.

Unfortunately, such devices are restricted to the use of atoms whose hyperfine transitions lie in a rather limited range of microwave frequencies. This is so because the microwave cavities employed in such devices must fit inside reasonably dimensioned vacuum chambers, and yet be large enough that the atomic (molecular) beam constitute only a small perturbation to the empty cavity Q, where Q is the ratio of energy stored in the cavity to energy input to the cavity per cycle.

Overcoming the problems set forth hereinabove is the laser excited molecular beam time and frequency standard as set forth in U.S. patent application No. 134,358, filed Mar. 27, 1980 by Leiby and Ezekiel. Unfortunately, the time and frequency standard by Leiby and Ezekiel referred to hereinabove tends to suffer in one respect, that is, the device is locked to a resonant frequency of an intermediate state whose linewidth can be much broader than the linewidth of the initial and final states depending on the selected molecule.

Consequently, there arises a need for a small, lightweight, rugged, simply constructed and inexpensive high performance clock or time and frequency standard which eliminates all the problems associated with the devices of the past and described hereinabove.

SUMMARY OF THE INVENTION

The instant invention overcomes the problems set forth hereinabove by providing an optically stimulated Raman molecular beam time and frequency standard which eliminates the use of a microwave cavity as well as state selection (preparation and post-detection) magnets and hot wire detectors, in conventional atomic beam clocks. With regard to the above-identified U.S. patent application No. 134,358 this invention eliminates the broad line width of the intermediate state so that the frequency stability is determined solely by the line width of the transition between the initial and final states. In addition, the time and frequency standard of this invention is also simplified in its construction as well as being small, lightweight, rugged, and inexpensive to produce.

The optically stimulated Raman molecular beam time and frequency standard of this invention utilizes a conventional molecular or atomic beam source, such as beam oven for producing molecules or atoms which are formed into a beam by collimating slits. It should be noted that since the term molecule encompasses particles such as atoms, the terms molecules and molecular beam will be utilized hereinafter throughout the specification in order to provide a more comprehensive description of this invention.

A first coherent electromagnetic beam of radiation from a first source of electromagnetic radiation such as a conventional compact semiconductor laser at a preselected frequency intercepts the molecular beam at a right angle and optically pumps the beam molecules from an initial state to an intermediate state. Since the radial velocities of the molecules in the highly collimated beam are negligibly small, this geometry guarantees that the optical transition will be essentially Doppler-free.

From the intermediate state the molecules spontaneously decay to both the initial state and final state. Upon continued pumping, the initial state is rapidly depleted leaving substantially all the beam molecules in the final state. The fluorescence associated with this process is detected and fed into a servo loop which locks the frequency of the laser to the resonant frequency corresponding to a transition between the initial state and the intermediate state. The molecular beam is now considered to be state selected.

At a point further down the beam, the molecules of the state selected beam are simultaneously pumped in what can be more commonly referred to as a stimulated Raman process by a second and a third beam of coherent electromagnetic radiation. The second beam is at a different frequency than the first beam and may therefore emanate from another source of electromagnetic radiation or it may be a portion of the first beam of electromagnetic radiation which has been frequency shifted. An advantage of frequency shifting the same electromagnetic source is that any frequency jitter associated with the first source is also associated with the second source and therefore has no affect on the frequency difference between the sources.

One method of frequency shifting the coherent electromagnetic beam is by means of a conventional acousto-optical modulator. The acousto-optical modulator acts as a moving thick grating driven by an external acoustic power source; consequently, the diffracted beam will be frequency shifted by an amount equal to the acoustic frequency. The fraction of the incident light that is frequency shifted does so in accordance with the input power of the acoustic driving source.

At the above mentioned point along the state selected beam, the third beam of electromagnetic radiation which is derived from the same source as the first beam is at the transition between the initial state and the intermediate state. The second beam at a different frequency (wavelength) than the first beam together with the third beam causes a direct transition between the initial and final states. This procedure is commonly referred to as a stimulated Raman process.

Therefore, the molecules behave exactly as if they had been pumped directly from the final state to the initial state by a coherent source of electromagnetic radiation whose frequency is equal to that associated with such a direct transition. This frequency is the difference between the frequencies of the first and second sources (lasers) of coherent electromagnetic radiation.

In the case of two independent laser sources being utilized with this invention, the point of maximum gain associated with the third beam is detected and utilized to lock the frequency of the second laser source to the resonant frequency corresponding to a transition between the final state and the intermediate state. The frequency difference between the locked first laser source and the second laser source is detected and acts as the time and frequency (clock) signal. This time and frequency signal can also be utilized to stabilize a high precision clock in a conventional manner.

With a single laser source utilized with this invention in the manner set forth above, the point of maximum gain associated with the third beam is detected and utilized to lock the frequency of, for example, a microwave source driving the acousto-optical modulator to the resonant frequency corresponding to a transition between the final state and the initial state. This locked frequency is at the frequency which can be readily utilized as the time and frequency standard and is output from the device of this invention. It should be noted that the linewidth between initial and final states can be further narrowed by use of the conventional technique of separated fields used in current cesium beam clocks.

It is therefore an object of this invention to provide a stimulated Raman molecular beam time and frequency standard which eliminates the broad line width of the intermediate state so that the frequency stability is determined solely by the line width of the transition between the initial and final states.

It is another object of this invention to provide a time and frequency standard which eliminates the use of a microwave cavity as well as state selection magnets and hot wire detectors within the device.

It is still another object of this invention to provide a time and frequency standard with greatly improved signal-to-noise ratio.

It is still another object of this invention to provide a time and frequency standard which is substantially more compact than time and frequency standards of the past.

It is a further object of this invention to provide a time and frequency standard in which maintaining the alignment of the molecular beam is greatly simplified.

It is still a further object of this invention to provide a time and frequency standard which is economical to produce and which utilizes conventional, currently available components in its manufacture.

For a better understanding of the present invention, together with other and further objects thereof, reference is made to the following description taken in conjunction with the accompanying drawing and its scope will be pointed out in the appended claims.

DETAILED DESCRIPTION OF THE PREFERRED EMBODIMENT

Figure 1:
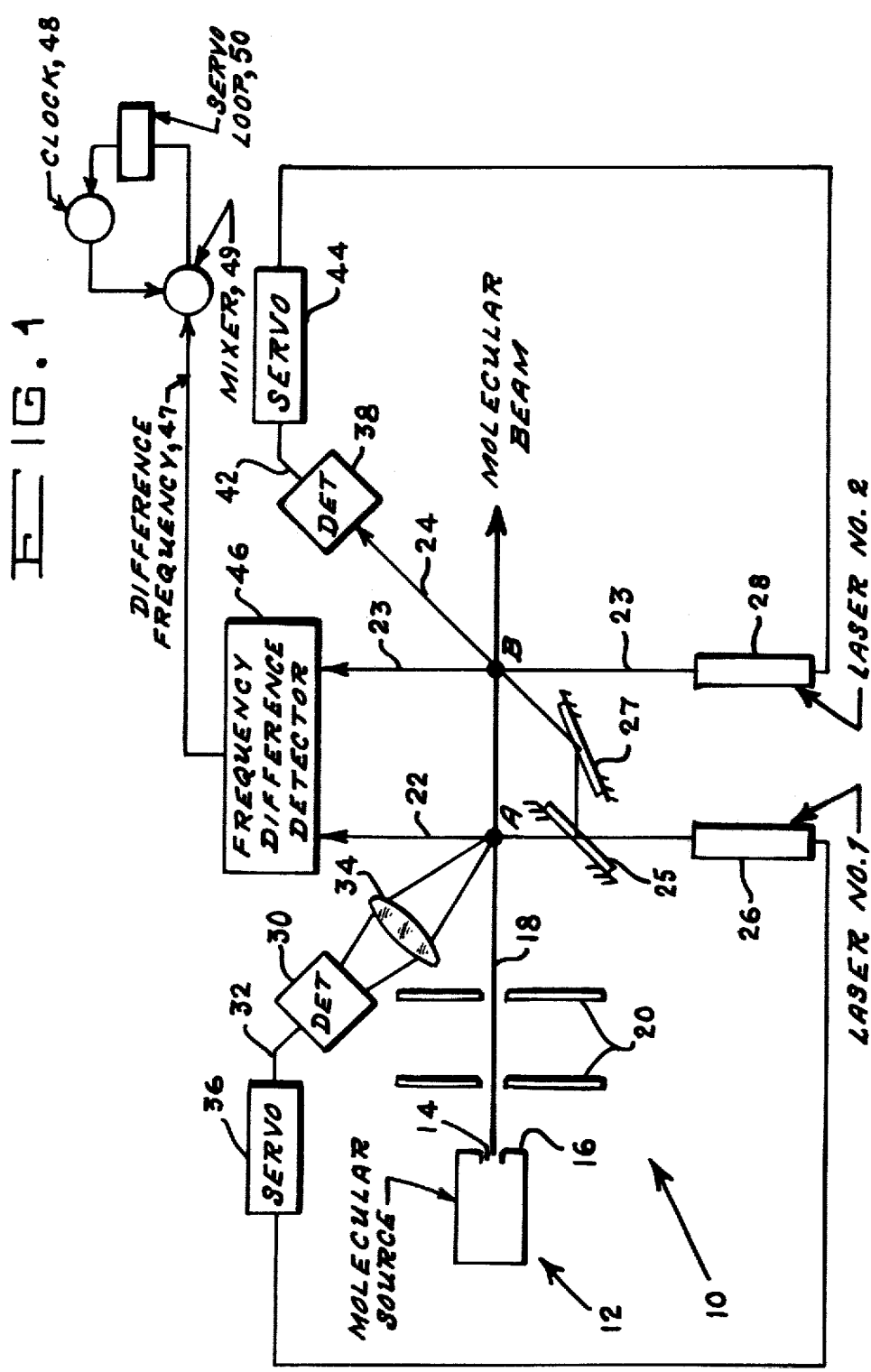
FIG. 1 is a schematic representation of the laser stimulated Raman molecular beam time and frequency standard of this invention.

Reference is now made to FIG. 1 of the drawing which schematically illustrates the laser stimulated Raman molecular beam time and frequency standard 10 of this invention. The frequency standard 10 of this invention utilizes a conventional molecular beam source 12 such as a beam oven of the type described in the publication by Leiby et al entitled "Molecular Beams and Effusive Flows" in *American Journal of Physics*, Vol. 47, No. 9, September 1979, pages 791 through 796 or in a book by N. F. Ramsey entitled "Molecular Beams", Oxford Press, London, 1956, Chapter 14. Molecules emanating from an aperture 14 in the wall 16 of beam oven 12 are formed into a molecular beam 18 by means of conventional collimating slits 20.

Intercepting molecular beam 18 at right angles thereto are a first, second and third coherent beam of electromagnetic radiation 22, 23 and 24, respectively, in a manner set forth in detail hereinbelow. Coherent electromagnetic beams 22 and 24 emanate from a first suitable electromagnetic radiation source such as conventional compact semi-conductor laser 26 while beam 23 emanates from a second suitable electromagnetic radiation source such as a conventional compact semi-conductor laser 28.

Reference is now made specifically to beam 22 which intersects molecular beam 18 at region A. As shown, for example, in the three level molecular system of FIG. 3 of the drawing, there are equal numbers of molecules in the initial state 1 and final state 3. It should, however, be realized that this invention is not limited to the particular three level system shown in FIG. 3, but for purposes of ease of understanding of this invention, the following description will refer thereto.

Figure 3:
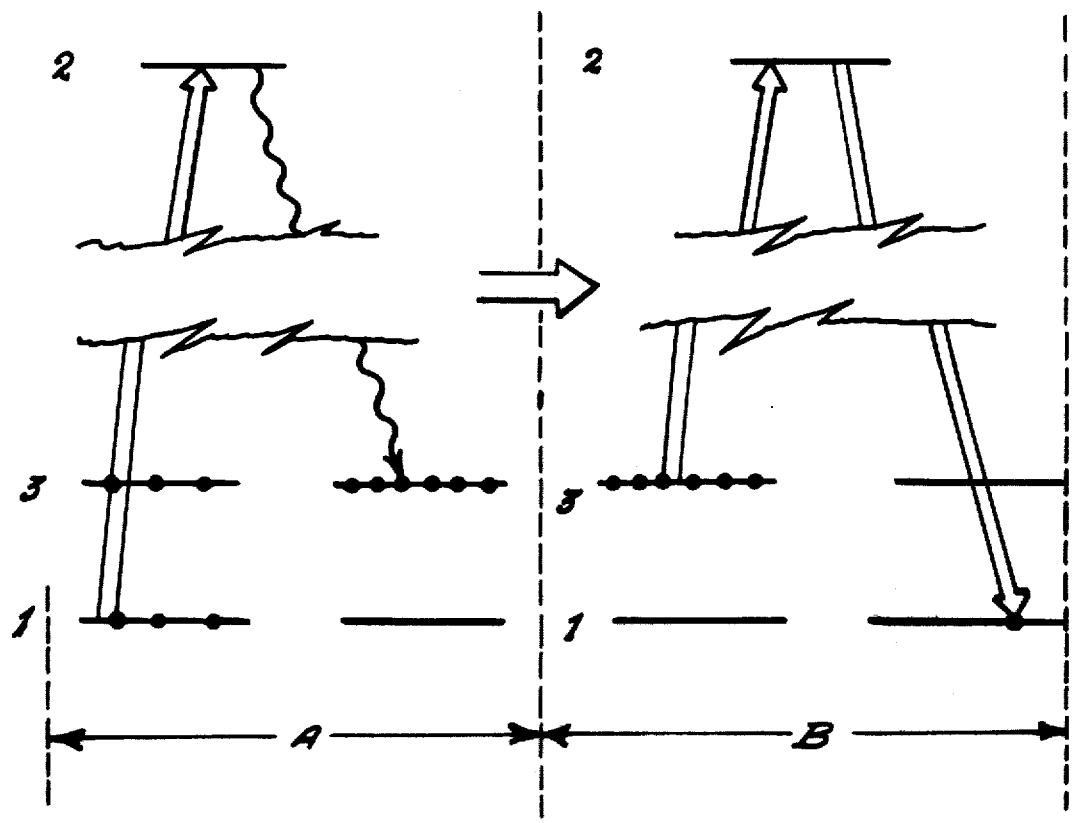
FIG. 3 is a schematic representation of a three level molecular system utilized with the time and frequency standard of this invention.

In region A (as shown in FIGS. 1 and 3) molecules are pumped by beam 22 between the initial state 1 and the intermediate state 2. Thereafter, the molecules spontaneously decay from intermediate state 2 to both the final state 3 and initial state 1. As shown in FIG. 3 of the drawing, upon continued pumping the initial state 1 is rapidly depleted leaving substantially all molecules in the final state 3, thereby state selecting molecular beam 18.

The fluoresence associated with the pumping at region A is detected by any conventional detector 30 which provides an output signal 32 in accordance therewith. Any suitable lens 34, if necessary, may be utilized with detector 30. Detector 30 feeds output signal 32 into a conventional servo loop 36 which locks the frequency of laser 26 to the center of the line corresponding to the transition between the initial state 1 and the intermediate state 2.

Referring once again to FIG. 1 of the drawing, at region B electromagnetic beams 23 and 24 simultaneously intersect beam 18 and the resulting excitation of beam molecules is commonly referred to as stimulated resonant Raman scattering, more fully described hereinbelow as well as in a paper by two of the inventors Hackel and Ezekiel entitled "Observation of Subnatural Linewidths by Two-Step Resonant Scattering" in $I_2$ Vapor, "*Physical Review Letters*", Vol. 42, No. 26, June 1979, pp 1736–1739. For the stimulated Raman process, one beam, beam 24 is at the same frequency as the initial pumping beam 22 while the other beam 23 is at a different frequency. Consequently, beam 24 may emanate from the same source 26 as beam 22 and is therefore locked to the transition between the initial state and the intermediate state (as shown in FIG. 3).

Conventional optics in the form of beam splitter 25 and mirror 27 are utilized to direct a portion of beam 22 in the form of beam 24 to intersect molecular beam 18 at region B. The other beam 23 in the embodiment of this invention shown in FIG. 1 of the drawing is produced by a separate laser 28.

Beam 23 at a different frequency than beam 24, together with beam 24 at region B causes a direct transition between the initial state 1 and final state 3. This procedure is referred to as the stimulated Raman process. The molecules, therefore, act as if they have been pumped directly from final state 3 to initial state 1 by a coherent source of electromagnetic radiation having a frequency equal to the direct transition. This frequency is the frequency difference between beam 23 and beam 24. For optimum efficiency, the frequencies of beams 23 and 24 would be adjusted so as to resonate with the transition between states 3 and 2 and states 1 and 2, respectively. This procedure is more commonly referred to as a stimulated resonant Raman process.

The point of maximum gain of beam 24 arising as a consequence of passing through region B of molecular beam 18 is detected adjacent to the B region by means of a conventional detector 38. Detector 38 provides a signal 42 in accordance therewith to feed a conventional servo loop 44 so as to lock laser 28 to the resonant frequency corresponding to the transition between the final state 3 and the intermediate state 2. However, it should be realized that other schemes for detecting the transition between states 3 and 1 may be utilized in place of detecting the maximum gain of beam 24.

Optically aligned with beams 22 and 23 is any conventional frequency difference detector 46 in the form of, for example, a lithium niobate or KDP crystal. Detector 46 provides a signal 47 representative of the frequency difference between locked beams 22 and 23. It is this frequency difference in the form of signal 47 which can be utilized as the time and frequency standard (clock signal) or as a signal to stabilize a conventional high precision clock 48 by the addition of a conventional mixer 49 and servo loop 51. In attaining signal 47, it should be noted that it is necessary to detect fluorescence only at region A but not at region B.

A problem, however, may result with the embodiment of this invention set forth in FIG. 1 of the drawing. That is, if frequency jitter is present in the output of either laser 26 or laser 28, the output clock signal 48 would be adversely affected. However, this frequency jitter may be cancelled to a degree by phase-locking or frequency offset-locking the two lasers. Alternatively, one laser may be used and a portion of its radiation frequency shifted by means of an acousto-optic, or electro-optic modulator, or by other frequency shifting means. Therefore, in order to eliminate the problem of frequency jitter as well as the need for an optical frequency difference detector, a further embodiment of this invention in the form of laser time and frequency standard 50 is described in detail hereinbelow. Since many of the same elements are used in time and frequency standard 50 as with time and frequency standard 10, the identical elements will be similarly identified in both embodiments.

Figure 2:
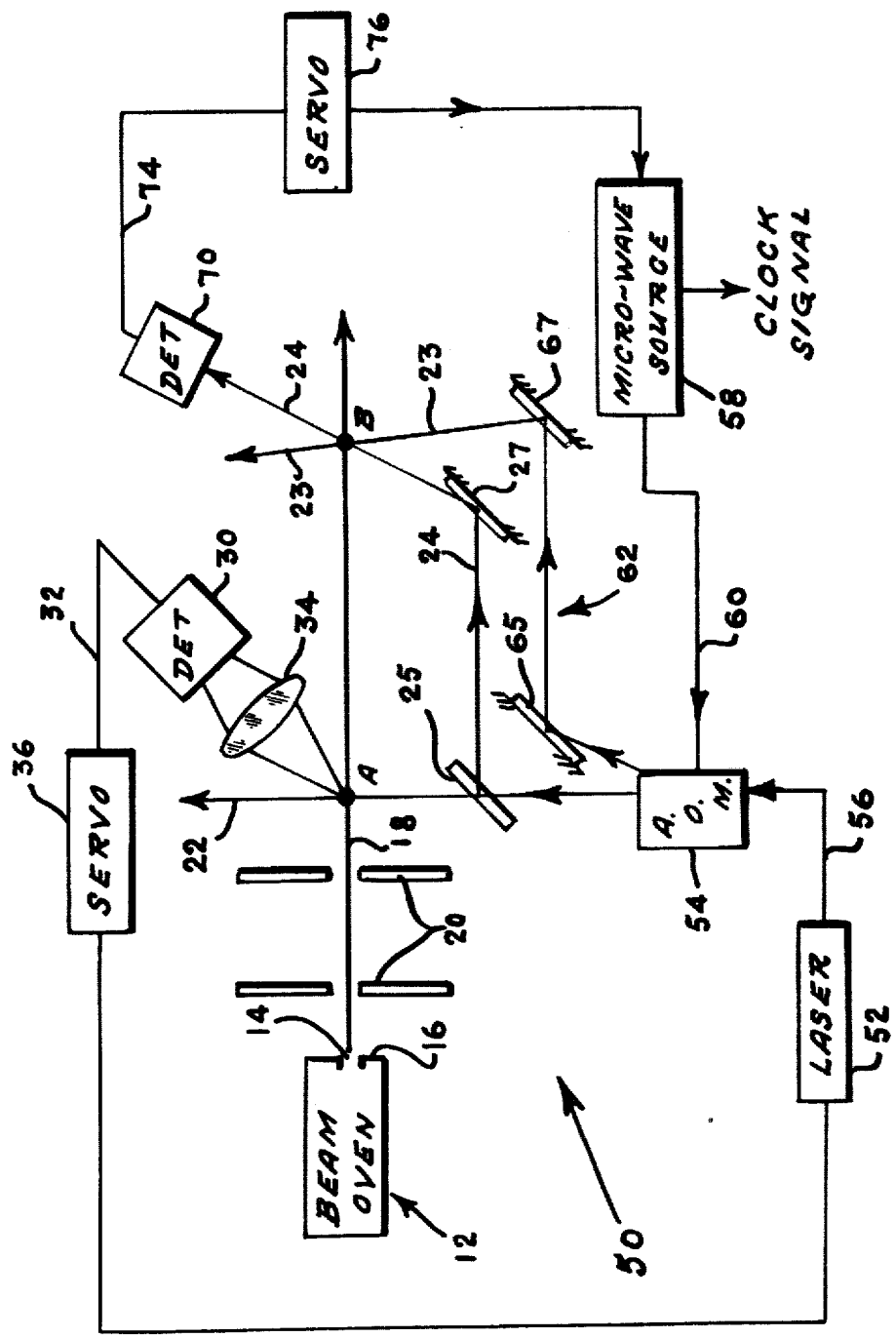
FIG. 2 is a schematic representation of a further embodiment of the laser stimulated Raman molecular beam time and frequency standard of this invention.

Reference is now made to FIG. 2 of the drawing which depicts in schematic fashion laser stimulated Raman molecular beam time and frequency standard 50 of this invention. Time and frequency standard 50 of this invention as with time and frequency standard 10 utilizes a conventional molecular beam source 12 such as a beam oven to provide a stream of molecules. The molecules are formed into a molecular beam 18 by means of conventional collimating slits 20.

In the embodiment of this invention shown in FIG. 2 of the drawing, in order to eliminate the effects of laser frequency jitter on the output and the need for frequency difference detector 46, a single source of coherent electromagnetic radiation in the form of, for example, a compact semi-conductor laser 52 is utilized to produce beams 22, 23 and 24. Therefore, as described in detail hereinbelow, all beams will contain the same frequency jitter and the effects thereof will be cancelled.

In order to provide a detailed explanation of the operation of this embodiment 50 of this invention, it is first necessary to explain the operation of a conventional acousto-optical modulator (A.O.M.) 54 which is optically aligned with an electromagnetic beam 56 emitted from laser 52. Acousto-optical modulator 54 is conventional and operates in conjunction with any suitable source of electromagnetic power such as, for example, a microwave source 58. The operation thereof is clearly described by T. Tamir, Ed., "Topics in Applied Physics," *Integrated Optics* Vol. 7, Springer-Verlag, New York, 1975, Chapter 4.

Acousto-optical modulator 54 is capable of dividing beam 56 into two portions 22 and 23 as well as altering or shifting the frequency (wavelength) of one of the portions 23 of electromagnetic beam 56. The modulator 54 acts as a moving thick diffraction grating with the modulated light emerging at the Bragg angle. A portion of the electromagnetic beam emerges at the same frequency as beam 56 entering modulator 54 and is represented as beam 22 in FIG. 2 of the drawing. The other portion of the electromagnetic beam 56 emerges from modulator 54 with an altered frequency and is referred to in FIG. 2 as beam 23. Beam 24, which is at the same frequency as beam 22, is taken from beam 22 by means of appropriate conventional optics such as beam splitter 25 and mirror 27.

The beam splitting and shifting of the laser frequency is accomplished by providing an input of electromagnetic power 60, for example, in the microwave range, from source of electromagnetic power 58 to acousto-optical modulator 54. The intensity of the frequency shifted portion (beam 23) is dependent upon the microwave input power level to the acousto-optical modulator 54. The amount of the frequency shift is equal to the microwave (acoustical) frequency. In addition, directing optics 62 in the form of any suitable number of conventional directing means, such as mirrors 65 and 67 are utilized to direct beam 23 in the manner indicated in FIG. 2 of the drawing.

Reference is now made specifically to beam 22 which intersects molecular beam 18 at region A where pumping of the molecules in beam 18 occurs in the same manner as pumping occurred with respect to time and frequency standard 10. Consequently, a detailed explanation of the pumping at region A is unnecessary. As with the embodiment depicted in FIG. 1, the molecules are pumped between the initial state 1 and the intermediate state 2. The molecules spontaneously decay to both the final state 3 and initial state 1. Continued pumping is necessary in order to deplete initial state 1 and leave substantially all molecules in final state 3. The fluoresence associated with this pumping at region A is detected by any conventional detector 30 which provides an output signal 32. Detector 30 feeds output signal 32 into a conventional servo loop 36 which locks the frequency of laser 52 to the center of the transition between the initial state 1 and intermediate state 2. The molecular beam 18 is now considered state selected.

The modulated portion 23 of the electromagnetic beam 56 entering acousto-optical modulator 54 which has been shifted in a manner described hereinabove intercepts molecular beam 18 at region B simultaneous with beam 24 which is at the same frequency as beam 22, that is locked to the transition between the initial state 1 and intermediate state 2. Beam 23, at a different frequency than beam 24, together with beam 24 at region B causes a direct transition between initial state 1 and final state 3. This procedure is referred to as the stimulated Raman process.

The point of maximum gain of beam 24 is detected in the B region by means of a conventional detector 70. Detector 70 provides a signal 74 in accordance therewith to feed a conventional servo loop 76 so as to lock microwave source 58 powering acousto-optical modulator 54 to the transition frequency between initial state 1 and final state 3. The output 60 of microwave source 58 is therefore at the frequency of the transition between the final state 3 and the initial state 1. This constitutes the time and frequency standard (clock signal) produced by this invention.

Since in this embodiment of the invention the frequency jitter associated with beams 23 and 24 is identical, the frequency difference between beams 23 and 24 is unaffected by this frequency jitter. Further, it should be realized, that no fluorescence need be detected at region B.

Although this invention has been described with reference to particular embodiments and illustrative of a three level atomic (molecular) system, it will be understood to those skilled in the art that this invention is also capable of a variety of further embodiments and having other atomic (molecular) systems within the spirit and scope of the appended claims. For example, since the linewidth between states 3 and 1 in the resonant Raman process of this invention is determined by the transition time of the molecules through region B, a substantial narrowing of this linewidth can be achieved by using Ramsey's method of separated oscillatory fields developed for microwave excitation and as described in the above-identified book by N. F. Ramsey entitled "Molecular Beams", Oxford Press, London, 1956, Chapter 5.

We claim:

1. A stimulated Raman molecular beam time and frequency standard comprising:
    (a) means for producing a molecular beam
    (b) means for producing a first beam of coherent electromagnetic radiation at a first preselected frequency and directing said first beam in a direction intersecting said molecular beam at a first preselected point,
    whereby said first beam intersecting said molecular beam at said first preselected point pumps the molecules of said molecular beam from an initial state to an intermediate state from which said molecules fluoresce to a final state thereby state selecting said molecular beam,
    (c) first means for detecting said fluorescence emitted from said intermediate state to said final state and producing a signal in accordance therewith,
    (d) means operably connected between said first detecting means and said means for producing said first electromagnetic beam for feeding said signal thereto in order to lock said preselected frequency of said first beam to the resonant frequency corresponding to the transition between said initial state and said intermediate state,
    (e) means for producing a second beam of coherent electromagnetic radiation at a second preselected frequency and directing said second beam in a direction intersecting said molecular beam at a second preselected point,
    (f) means for directing a portion of said first beam in the form of a third beam at said first preselected frequency in a direction intersecting said molecular beam at said second preselected point simultaneous with said second beam, whereby said second beam together with said third beam intersecting said state selected molecular beam at said second preselected point causes a direct transition between said initial state and said final state in a stimulated Raman process, (g) second means for detecting the point of maximum gain of said third beam and producing a signal in accordance therewith, (h) means operably connected between said second detecting means and said means for producing said second electromagnetic beam for feeding said signal thereto in order to lock said preselected frequency of said second electromagnetic beam to a resonant frequency corresponding to the transition between said final state and said intermediate state, and (i) means optically aligned with said first and second locked electromagnetic beams for detecting a difference in frequency therebetween, said frequency detecting means producing an output signal representative of said frequency difference.

2. A stimulated Raman molecular beam time and frequency standard as defined in claim 1 wherein said first and said second electromagnetic radiation producing means each being a laser.

3. A stimulated Raman molecular beam time and frequency standard as defined in claim 2 wherein said means for producing said molecular beam comprises a beam oven and at least one beam collimating means.

4. A stimulated Raman molecular beam time and frequency standard comprising:
(a) means for producing a molecular beam,
(b) means for producing a beam of coherent electromagnetic radiation at a first preselected frequency,
(c) means in optical alignment with said electromagnetic beam for (1) directing a portion of said electromagnetic beam as a first electromagnetic beam at said first preselected frequency in a direction intersecting said molecular beam at a first preselected point, (2) altering said first preselected frequency of the other portion of said electromagnetic beam, and (3) directing said other portion of said electromagnetic beam as a second electromagnetic beam at a second preselected frequency in another direction intersecting said molecular beam at a second preselected point spaced apart from said first preselected point,
(d) means for directing a portion of said first beam in the form of a third beam of electromagnetic radiation at said first preselected frequency in a direction intersecting said molecular beam at said second preselected point simultaneous with said second beam, whereby said first beam intersecting said molecular beam at said first preselected point pumps the molecules in said molecular beam from an initial state to an intermediate state from which said molecules fluoresce to a final state thereby state selecting said molecular beam, (e) first means for detecting said fluorescence emitted from said intermediate state to said final state and producing a signal in accordance therewith, (f) means operably connected between said first detecting means and said means for producing said electromagnetic beam for feeding said signal hereto in order to lock said preselected frequency of said first electromagnetic beam to the resonant frequency corresponding to the transition between said initial state and said intermediate state, whereby said second beam together with said third beam intersecting said state selected molecular beam at said second preselected point causes a direct transition between said initial state and said final state in a stimulated Raman process, (g) second means for detecting the point of maximum gain of said third beam and producing a signal in accordance therewith, (h) said beam directing and altering means including means for producing coherent electromagnetic power at a preselected frequency, said frequency of said power produced by said power producing means determining said preselected frequency of said second electromagnetic beam, and (i) means operably connected between said second detecting means and said power producing means for feeding said signal to said power producing means in order to lock said preselected frequency of said electromagnetic power to the transition between said final state and said initial state, whereby said power producing means outputs a signal at the frequency of said locked frequency corresponding to the transition between said final state and said initial state.

5. A stimulated Raman molecular beam time and frequency standard as defined in claim 4 wherein said first electromagnetic radiation producing means is a laser.

6. A stimulated Raman molecular beam time and frequency standard as defined in claim 5 wherein said beam directing and altering means further includes an acousto-optical modulator.

7. A stimulated Raman molecular beam time and frequency standard as defined in claim 6 wherein said electromagnetic power producing means is a microwave source.

8. A stimulated Raman molecular beam time and frequency standard as defined in claim 7 wherein said means for providing said molecular beam comprises a beam oven and at least one beam collimating means.

9. A stimulated Raman molecular beam time and frequency standard as defined in claim 8 wherein a first servo loop connects said first detecting means to said laser and a second servo loop connects said second detecting means to said microwave source.

* * * * *